WIDE-RANGE RADIO-FREQUENCY TUNER

Filed April 29, 1953

INVENTORS:
Harold T. Lyman and
Milton M. Pupper,
BY Amos, McDougall, Williams & Hersh,
ATTORNEYS.

2,873,373
Patented Feb. 10, 1959

2,873,373

WIDE-RANGE RADIO-FREQUENCY TUNER

Harold T. Lyman, Milford, and Milton M. Tupper, Norwalk, Conn., assignors to Aladdin Industries, Incorporated, Chicago, Ill., a corporation of Illinois Application April 29, 1953, Serial No. 351,868

2 Claims. (Cl. 250—40)

Figure 1:
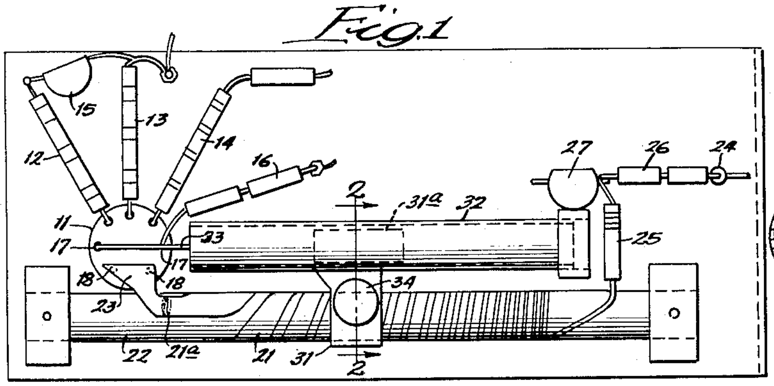

This invention relates to a wide-range radio-frequency tuner of novel design and to a coil particularly adapted for use therein.

In numerous modern applications for radio-frequency tuners, a frequency range in the neighborhood of ten to one is desirable. An example of such an application is a television tuner designed to cover in a single tuning operation the V. H. F. and U. H. F. channels currently employed for television broadcasting in the United States. The local oscillator of such a tuner must cover approximately the frequency range between 100 and 1,000 megacycles per second. The mixer and radio-frequency amplifier tuned circuits must cover substantially the frequency range between 60 and 900 megacycles per second, a narrower range in the absolute sense than is required for the oscillator circuit but wider in terms of frequency ratio.

As has already been disclosed in U. S. patent application No. 305,629, Wide-Range Radio-Frequency Tuner, Harold T. Lyman, inventor, it is possible to design a tuner in which, in a single tuning operation, a frequency range as great as one hundred to one can be covered. That extremely wide tuning range requires the use, however, of apparatus permitting relative movement between a suitably designed coil and two energy-transfer elements adapted for cooperation therewith.

In the present specification we describe a wide-range tuner in which one energy-transfer connection to the tuning inductor can be a fixed, permanent one. While the possible tuning range of the present tuner is not as great as that of the invention described in said patent application 305,629, the present tuner can readily attain a frequency range in the neighborhood of twenty to one while maintaining good circuit "Q" over the entire range.

It is accordingly the primary object of the present invention to provide a radio-frequency tuning device adapted to cover in a single tuning operation a frequency range greater than ten to one and characterized by a construction in which one radio-frequency energy-transfer connection between the coil and the external circuit may be fixed and permanent.

A further object of the present invention is to provide a wide-range radio-frequency tuner in which the coil may be fixed in position relative to the tube and other circuit elements.

A still further object of the present invention is to provide, in a wide-range radio-frequency tuner, a coil characterized by non-uniform inductance per unit length and particularly well adapted to raise the maximum frequency attainable with a wide-range tuner.

Still another object of the invention is to provide, in a tuner adapted for V. H. F. and U. H. F. application, a novel construction permitting movement of an energy-transfer element along the length of an inductor as a means of tuning the same without sliding contacts and without objectionable circuit inductance externally of the coil proper.

Other objects and advantages of the invention will appear from the detailed description of the invention which follows.

Figure 2:
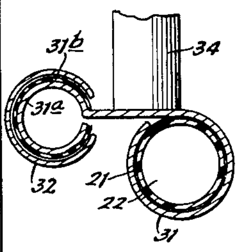
Figures 3, 4:
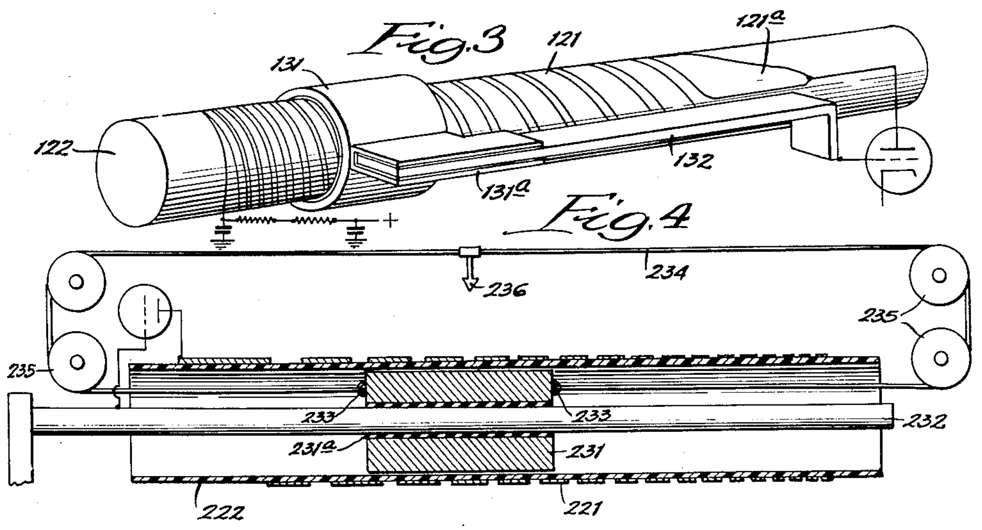
Figure 5:
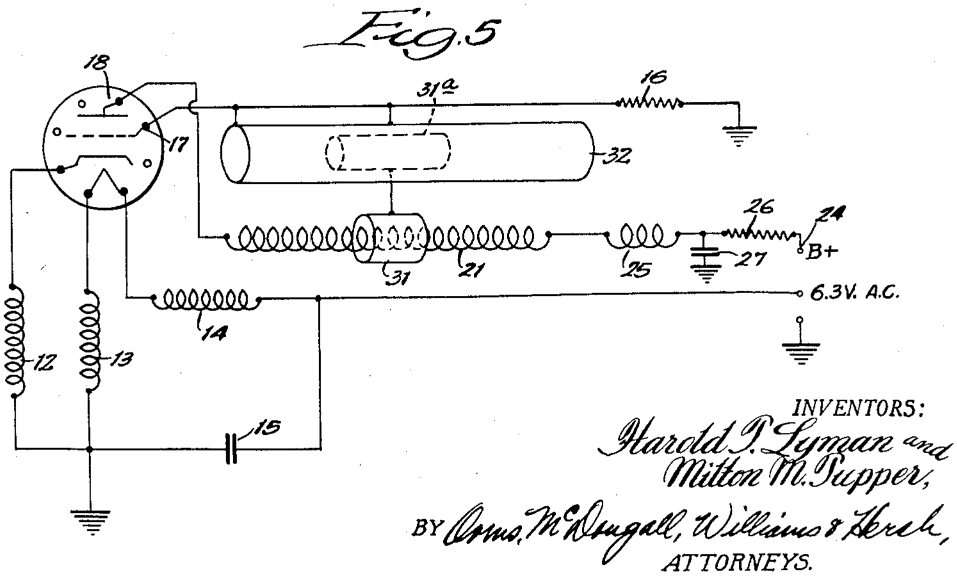

In the appended drawing, we have shown three alternative embodiments of the invention, which, although differing from one another in structural details, are all generally similar to principle. Figure 1 is a semi-diagrammatic view of a simple vacuum-tube device embodying our invention, such as, for example, a local oscillator for a television receiver. Fig. 2 is a fragmentary sectional view of the Fig. 1 device, taken along the line 2—2 of Fig. 1. Fig. 3 is a perspective view showing an alternative structural arrangement which may be used in the Fig. 1 apparatus. Fig. 4 is a semi-diagrammatic showing of still another embodiment of our invention, the apparatus of Fig. 4 being of particular interest in that it is well adapted to be tuned by the popular drive-cord method. Fig. 5 is a schematic diagram showing the electrical equivalent circuit of a U. H. F. oscillator embodying our invention.

Referring now to Fig. 1, we have diagrammatically shown therein a typical oscillator or amplifier employing a miniature vacuum tube, whose socket is denoted 11. U. H. F. chokes 12, 13, and 14, by-pass capacitor 15, and resistors, such as 16, are conventional and do not of themselves form any part of the present invention.

The present invention relates to the R. F. resonant circuit connected between the grid terminals 17 of the tube 11 and the plate terminals thereof, denoted 18. (To minimize lead inductance, U. H. F. tubes are often provided with more than one external socket terminal, normally connected in parallel in the circuit. It will be understood that the particular tube shown, and the particular socket connections shown, are purely illustrative.)

Mounted alongside socket 11 we have provided an elongated coil 21, formed on a suitable low-loss cylindrical coil form 22. Coil 21 is of the type having non-uniform inductance per unit length. Such coils are sometimes called "variable pitch" coils; the particular coil illustrated in Fig. 1, which we have found to possess unusual usefulness in apparatus of this type, is characterized by varying pitch, varying conductor width, and varying spacing between adjacent turns. None of those varying parameters possesses any abrupt discontinuities in the coil shown, the conductor width and space between turns increasing gradually (but not necessarily linearly) from right to left as the coil is viewed in Fig. 1. The number of turns per unit length decreases from right to left, as the coil is similarly viewed. The extreme left end of the coil, at the end whereat inductance per unit length is lost, is modified in a particular manner which we have found to be highly important in wide-range tuning circuits; the details of that coil construction will be more fully treated in a subsequent paragraph hereof.

The particular manner of construction of coil 21 on form 22 is a matter of designer's choice; we prefer a coil in which the orientation of conducting ribbon is determined photographically. The coil, however, may be made by laying on pre-cut copper ribbon or metal foil, or in any other suitable manner. In any case, however, the finished coil should preferably be coated with a tough, low-loss plastic coating or covered with a thin plastic sleeve. This coating protects the coil against mechanical damage and at the same time may serve the function of insulator between the coil and the movable energy-transfer element presently to be described.

The left-hand end of coil 21, as viewed in Fig. 1, is connected directly to the plate terminals of socket 11 by means of a ribbon conductor 23, used instead of a wire to minimize circuit inductance. The other end of coil 21 may be connected to the positive terminal 24 of a suitable D.-C. voltage source through a plate choke 25 and a decoupling resistor 26. The junction of choke 25 and resistor 26 may be by-passed to ground by a suitable capacitor 27.

Slidably fitted over the outer surface of coil 21 on form 22 is a sleeve 31 which, in the embodiment shown, fits nearly all the way around the circumference of coil 21. (The construction of sleeve 31 may be best observed in Fig. 2.) Sleeve 31, as may be seen from both Figs. 1 and 2, has a lateral extension **31*a*, formed into a cylindrical shape and carried within slotted cylindrical member 32. Extension 31*a*** is preferably provided with a low-loss insulating surface, which may be a deposition of suitable low-loss shellac or, if desired, may be a thin plastic sleeve suitably cemented or otherwise affixed in place.

Slotted sleeve 32 is mounted parallel to coil form 22 and oriented so as to bring one end adjacent one of the grid pins 17 of socket 11. A suitable conductor 33 joins cylindrical element 32 to the grid pins 17, the other end of element 32 being permitted to "float," in the electrical sense. As may be noted from Fig. 2, cylindrical element 32 is provided with an axial slot along its entire length, on the side facing coil 21, so that energy-transfer sleeve 31 can slide freely along the entire length of coil 21, carrying with it inside element 32 its extension **31*a***.

Element 32 is a low-inductance conductor, serving to carry radio-frequency currents from energy-transfer element 31 to the grid terminals 17 without contributing thereby any substantial amount of inductance to the circuit. The low-inductance characteristic is accomplished by the very large surface area of element 32, which is greatly increased by its slotted cylindrical shape. The insulating coating **31*b* maintains extension 31*a* and element 32** insulated from one another and at the same time facilitates a smooth sliding action between the two members.

If desired, sleeve 31 may be provided with an upright rod extension 34 to facilitate movement of element 31 along coil 21. Any desired means of accomplishing such movement may of course be used. In most practical installations, movement of energy-transfer element 31 will be "ganged" with the movement of similar sliding elements in other circuits, so that some such mechanical connection as rod 34 is usually a convenience.

*Operation of Fig. 1 embodiment*

The primarily effective portion of coil 21 in the operation of the Fig. 1 embodiment of our invention consists of that portion which lies between the coil terminal **21*a*, connected to plate pins 18, and the energy-transfer sleeve 31. That portion of the coil is in the resonant circuit which governs the frequency of oscillation or amplification, as the case may be. The remainder of coil 21 functions in effect as a plate choke, supplementing the function of choke coil 25**.

Energy transfer between coil 21 and sleeve 31 is capacitive in character, as is also the high-frequency energy transfer between extension **31*a* and slotted cylinder 32**.

The resonant circuit as a whole consists of a closed series loop embodying the following elements: The grid-to-plate capacitance of the tube in socket 11, the portion of coil 21 between the plate pins 18 and sleeve 31, the capacitance between coil 21 and sleeve 31, the capacitance between extension **31*a* and slotted cylinder 32, the inductance of that portion of slotted cylinder 32 lying between element 31*a* and grid pins 17. In addition, the resonant frequency of that circuit is affected to some extent by stray circuit inductance and capacitance, and by the loading effect of the "stub" portion of slotted cylinder 32. We have found, however, that so long as the length of slotted cylinder 32 is kept substantially less than a quarter wavelength at the highest frequency to be dealt with, the effect of the stub portion of cylinder 32** is not significant, either with respect to resonant frequency or with respect to circuit losses.

Tuning of the circuit is accomplished by sliding sleeve 31 along the coil 21. We have found that an amplifier or oscillator constructed in accordance with Fig. 1 can readily be made to cover the entire frequency range from, for example, 60 megacycles to 900 megacycles by movement of sleeve 31 from the far end of coil 21 to the end adjacent socket 11. The tuned circuit exhibits good "Q" and stability at any frequency one may choose within that wide range of approximately fifteen to one frequency ratio.

We have found that the maximum frequency attainable with a given coil can be greatly improved when the coil is designed with its high-frequency end proportioned in the manner shown in Fig. 1 near terminal **21*a*. The width of the conducting ribbon which forms coil 21 gradually increases as terminal 21*a* is neared, until finally in the last quarter turn or thereabouts its axial width very rapidly increases, while at the same time the pitch is increased to such an extent that the circumferential width of the conductor is substantially reduced. The construction described leads to a terminal of the sort shown in Fig. 1 and illustrated in perspective in Fig. 3, where the shaped terminal of the coil is denoted 121*a***.

We have found that the maximum attainable frequency is very substantially greater when the high-frequency end of the coil is terminated in the manner shown than when the coil is conventionally designed.

While we have not considered it necessary to describe Fig. 5 in detail, those skilled in the art will observe that that schematic diagram reproduces the electrical circuit of the apparatus shown in Fig. 1 and described in the foregoing paragraphs of this specification.

*The Fig. 3 embodiment*

The Fig. 3 embodiment of our invention employs a coil 121 wound on a form 122, which may in both cases be identical to the corresponding elements 21 and 22 in Fig. 1. The distinction between the Fig. 3 structure and that heretofore described consists in the conformation of the energy-transfer sleeve 131, its extension **131*a*, and in the conformation of the elongated, low-inductance conductor 132, which corresponds functionally to the slotted cylinder 32** in Fig. 1.

As may be note from Fig. 3, the sleeve portion of element 131 may be substantially like the corresponding portion of the Fig. 1 device, but, instead of the slotted cylinder arrangement of Fig. 1, we have in Fig. 3 shown a "sandwich" coupling arrangement by which the extension **131*a* of the energy-transfer sleeve consists of a pair of parallel vanes between which a wide, flat conductor 132 is carried. The surfaces of extension 131*a* which are closely adjacent conductor 132 may be coated with low-loss plastic or otherwise insulated so as to limit energy transfer to capacitive interchange. Just as with the Fig. 1 embodiment, the high-frequency end of the coil is permanently connected to one of the tube electrodes, such as the plate, and the low-inductance conductor 132** is fixedly connected to another tube electrode, such as the grid.

*The Fig. 4 embodiment*

In Fig. 4, we have shown a variant on the Fig. 1 apparatus which in many applications is particularly convenient. In that structure, a coil 221 is wound on a hollow form 222, which, in this case, performs the double functions of support for the coil and as insulation between the coil and the energy-transfer element 231. Element 231 in this embodiment consists of a metal cylindrical slug provided with an axial central aperture and slidably carried on a rod 232. Some suitable means should be provided for insulating slug 231 from rod 232, such as the thin plastic sleeve **231*a*. (Obviously, a suitable insulating layer may either be carried by the slug 231 or may be deposited over the surface of rod 232.) In the embodiment shown, the low-inductance conductor corresponding to the slotted cylinder 32 is the rod 232, and it may be connected directly to the grid of the tube with which the apparatus is used. Similarly, the high-frequency end of coil 221** may be permanently connected to the plate of the tube.

An interesting point concerning the Fig. 4 embodiment is that it is particularly adapted to be adjusted by means of the well-known string-drive or cord-drive which has been for years popular in radio apparatus. To facilitate that, slug 231 is provided on each end face with an eyelet 233, to which is connected the ends of a drive cord 234. The drive cord 234 will normally extend over various pulleys 235 and may, if desired, include a dial pointer 236.

The operation of the Fig. 4 embodiment is generally similar to that of the other two embodiments; that is, the portion of the coil effective at any given time in the high-frequency resonant circuit is that portion which lies between the slug 231 and the high-frequency end of the coil, to which the tube is directly connected. The inductance of rod 232 may be made quite small if the rod is fairly substantial in diameter, and we have found no difficulty in reaching frequencies in excess of 1,000 megacycles per second with the Fig. 4 embodiment.

In all the embodiments of our invention herein shown and described, a very wide range of frequencies may be tuned in a single tuning movement, without either sliding or rolling contacts, switching, or any of the other noise-creating expedients usually required in tuners adapted to cover frequency ranges in excess of ten to one. The capacitance between the energy-transfer element and the coil, and between the extension on the energy-transfer element and the elongated, low-inductance conductor is normally much greater than the interelectrode capacitance which forms a part of the tuned circuit in an assembled apparatus. As a result, the tuning characteristics of the circuit are affected practically not at all by the small variations in capacitance which occur as the energy-transfer element is moved from one end of the coil to the other. We have found the disclosed invention capable of providing stable tuning over frequency ranges as great as twenty to one, and have found our invention to be quiet in operation and high in circuit efficiency at all frequencies within its tuning range.

While we have in this specification described for purposes of illustration several specific embodiments of our invention, it is to be understood that those are solely for illustrative purposes. Many changes in matters of detail may be made therein without departing from the spirit of our invention.

We claim:

1. A tunable resonant circuit for radio-frequency currents comprising a stationary elongated inductance coil, one end of said coil having a portion forming a first circuit terminal for establishing an external circuit connection to said one end of said coil, a generally cylindrical conductive energy-transfer element adapted to interchange radio-frequency energy with the coil and mounted around and closely adjacent the coil for movement longitudinally along the coil, insulating means spacing said transfer element from said coil and operative to limit energy transfer therebetween to capacitive energy exchange, a stationary low-inductance elongated conductor, having large surface area, extending parallel to said coil a distance substantially less than a quarter wavelength at the highest frequency to be attained by said tuner and being fixed relative to said coil, a conductive electrode movable with said transfer element and along said elongated conductor in close surface-to-surface proximity thereto over the entire range of movement of said transfer element, and second insulating means separating said electrode and said conductor and operative to limit energy transfer therebetween substantially to capacitive energy exchange, means for moving the transfer element along the coil, and a portion at one end of said conductor forming a second circuit terminal for establishing an external circuit connection to said conductor, said first and second circuit terminals being at corresponding ends of said coil and conductor and being closely adjacent each other to minimize the minimum inductance of said coil and conductor, the inductance of said coil and said conductor being decreased concurrently by movement of said energy-transfer element toward said one end of said coil.

2. A tunable resonant circuit for radio-frequency currents comprising a stationary elongated inductance coil, one end of said coil having a portion forming a first circuit terminal for establishing an external circuit connection to said one end of said coil, a generally cylindrical conductive energy-transfer element adapted to interchange radio-frequency energy with the coil and mounted around and closely adjacent the coil for movement longitudinally along the coil, insulating means spacing said transfer element from said coil and operative to limit energy transfer therebetween to capacitive energy exchange, a stationary low-inductance elongated conductor, having large surface area, extending parallel to said coil a distance substantially less than a quarter wavelength at the highest frequency to be attained by said tuner and being fixed relative to said coil, a conductive electrode movable with said transfer element and along said elongated conductor in close surface-to-surface proximity thereto over the entire range of movement of said transfer element, and second insulating means separating said electrode and said conductor and operative to limit energy transfer therebetween substantially to capacitive energy exchange, means for moving the transfer element along the coil, and a portion at one end of said conductor forming a second circuit terminal for establishing an external circuit connection to said conductor, said first and second circuit terminals being at corresponding ends of said coil and conductor and being closely adjacent each other to minimize the minimum inductance of said coil and conductor, the inductance of said coil and said conductor being decreased concurrently by movement of said energy-transfer element toward said one end of said coil, said conductor being a hollow generally cylindrical tube with a longitudinal slot therein, said electrode being a generally cylindrical member slidable within said tube and having an arm extending outwardly through said slot and connected to said energy-transfer element.

References Cited in the file of this patent

UNITED STATES PATENTS

| | | |
|---|---|---|
| 2,458,071 | Gordon | Jan. 4, 1949 |
| 2,469,168 | Loughlin | May 3, 1949 |
| 2,531,231 | Million | Nov. 21, 1950 |
| 2,641,708 | Carlson | June 9, 1953 |
| 2,705,288 | Wallin | Mar. 29, 1955 |
| 2,717,313 | Wen Yuan Pan | Sept. 6, 1955 |

FOREIGN PATENTS

| | | |
|---|---|---|
| 66,246 | Denmark | Jan. 12, 1948 |
| 439,147 | Great Britain | Nov. 29, 1935 |